United States Patent
Samoto et al.

[11] Patent Number: 6,090,523
[45] Date of Patent: Jul. 18, 2000

[54] MULTI-RESIN MATERIAL FOR AN ANTIREFLECTION FILM TO BE FORMED ON A WORKPIECE DISPOSED ON A SEMICONDUCTOR SUBSTRATE

[75] Inventors: Norihiko Samoto; Haruo Iwasaki; Atsushi Nishizawa; Tsuyoshi Yoshii; Hiroshi Yoshino, all of Tokyo, Japan

[73] Assignee: NEC Corporation, Tokyo, Japan

[21] Appl. No.: 09/054,885

[22] Filed: Apr. 3, 1998

[30] Foreign Application Priority Data

Apr. 17, 1997  [JP]  Japan .................................. 9-100095

[51] Int. Cl.$^7$ ...................................................... G03C 1/76
[52] U.S. Cl. ........................................ 430/271.1; 430/512
[58] Field of Search ............................... 430/271.1, 512, 430/313; 525/134, 154, 451, 502, 508

[56] References Cited

U.S. PATENT DOCUMENTS

| | | |
|---|---|---|
| 4,910,122 | 3/1990 | Arnold et al. . |
| 5,597,868 | 1/1997 | Kunz ........................................ 525/154 |
| 5,759,755 | 6/1998 | Park et al. ............................... 430/512 |
| 5,851,738 | 12/1998 | Thackeray et al. ..................... 430/327 |
| 5,891,959 | 4/1999 | Kunz ........................................ 525/107 |

FOREIGN PATENT DOCUMENTS

| | | |
|---|---|---|
| 1-128434 | 5/1989 | Japan . |
| 1-130527 | 5/1989 | Japan . |
| 5-47656 | 2/1993 | Japan . |
| 7-226396 | 8/1995 | Japan . |
| 9-43839 | 2/1997 | Japan . |
| 9-45614 | 2/1997 | Japan . |
| 9-63935 | 3/1997 | Japan . |
| 9-167733 | 6/1997 | Japan . |
| 9-321023 | 12/1997 | Japan . |
| 10-199789 | 7/1998 | Japan . |

OTHER PUBLICATIONS

Semiconductor World, "Antireflection Technique (Method of Application) For Control of Fluctuation of Dimension 0.3 μm Precision of Litho. Dimension and Precision of Superposition", Jun. 1995, pp. 100–102.

*Primary Examiner*—S. Rosasco
*Attorney, Agent, or Firm*—Young & Thompson

[57] ABSTRACT

An antireflection film includes a base resin and an additive resin, the additive resin having a dry etching rate higher than that of the base resin. A photoresist pattern is formed and the antireflection film is selectively etched using the photoresist pattern as a mask. The molecular weight and weight percent of the additive resin are selected to provide an etching rate for the antireflection film that permits selective removal of the antireflection film while leaving an effective amount of the photoresist.

6 Claims, 4 Drawing Sheets

MULTI-RESIN MATERIAL FOR AN ANTIREFLECTION FILM TO BE FORMED ON A WORKPIECE DISPOSED ON A SEMICONDUCTOR SUBSTRATE

BACKGROUND OF THE INVENTION

1. Field of the Invention

The present invention relates to a material to be used for an antireflection film to be formed on a workpiece disposed on a semiconductor substrate and a method of manufacturing a semiconductor device using the same material, particularly to a material for forming an antireflection film to be prepared directly under a photoresist film to improve the processing accuracy of the photoresist.

2. Description of the Related Art

In case of the resist patterning through light exposure, the resist pattern has often suffered from a disfigurement (notching) caused by light reflected from a different level part of the substrate or suffered from the dimensional variation of the resist pattern induced by the thickness fluctuation of the resist film. For solving the above problem, there is proposed a method which forms an antireflection film directly under a resist film for preventing the reflection of exposure light, thereby decreasing the reflection light from the substrate. This antireflection film is divided into two types, one is an organic film formed by spin coating applied on a workpiece as is the case with a resist, the other is an inorganic film formed by a CVD (Chemical Vapor Deposition) method. These methods have the following features, respectively.

The inorganic antireflection film can be formed to the fixed thickness irrespective of the difference in the surface level of the workpiece, and hence it is possible to decrease the dry etching time and reduce the dimension conversion difference between the resist and the antireflection film, the dimensional variation of the resist pattern is generated due to a resist thickness change caused by the existing surface level difference.

The organic antireflection film can be formed by coating a material in the same way as the resist film, and hence it has a tendency that the surface level difference of the substrate can be flattened, and accordingly the film tends to have the uniform thickness without being affected by the existence of the surface level difference, thereby allowing to control the dimensional variation due to the fluctuation of the thickness of the resist film. The organic antireflection film is produced by adding an ultraviolet light absorber to the resin material (such as polyimide) which generally constitutes a base.

The technique concerning the coating type antireflection film of this kind has been known to the public, being disclosed in a monthly "Semiconductor World", July, 1995. pp. 100–102 for, example.

FIG. 1A to FIG. 1E are sectional views each showing, in the process order, a manufacturing method of the conventional semiconductor device which utilizes a coating type antireflection film. As shown in FIG. 1A, workpiece 32 is first formed on semiconductor substrate 31, then successively coating type antireflection film 33 is formed, and photoresist film 34 is formed on antireflection film 33. The photoresist 34 is selectively exposed through an exposure mask to the exposure light, such as infrared radiation or a KrF excimer laser beam, and as shown in FIG. 1B, developed to form resist film pattern 34a of etching-proof property. Next, as shown in FIG. 1C, dry etching operation is selectively applied to antireflection film 33 using resist film pattern 34a as a mask to form antireflection film pattern 33a. Through this process, the film thickness of resist film pattern 34a is reduced, being concurrently etched. Then, as shown in FIG. 1D, by using this etching-proof resist film pattern 34a and antireflection film pattern 33a as a mask, workpiece 32 is selectively etched to form workpiece pattern 32a. Next, as shown in FIG. 1E, by using oxygen ($O_2$) plasma, residual resist film pattern 34a and antireflection film pattern 33a are removed through ashing, thereby obtaining a desired workpiece pattern 32a.

Under the present conditions, the dry etching selectivity of the photoresist is not sufficiently high against the antireflection film. Therefore, as shown in FIG. 2A, when antireflection film 33 and resist film pattern 34a are formed on workpiece 32 which has a large difference in the surface level and the antireflection film is etched using resist film pattern 34a as the mask, at the processing stage that the antireflection film etching is completed in the concave portion having a thick film, as shown in FIG. 2B, the residual film of resist film pattern 34a has become unable to secure a sufficient film thickness. As a result, as shown in FIG. 2C, when dry etching workpiece 32, resist film pattern 34a vanishes and further antireflection film pattern 33a partially disappears. Consequently, as shown in FIG. 2D, the pattern of the workpiece is deformed when the patterning of workpiece 32 is completed.

Therefore, a problem to be solved by the present invention is to prepare a method such that a photoresist film can secure the sufficient etching selectivity against the antireflection film, the reduction in film thickness of the photoresist film can be controlled when the antireflection film patterning is executed, and accordingly the workpiece patterning can accurately be performed.

SUMMARY OF THE INVENTION

The above problem of the present invention can be solved by adding the specific resin to a coating type antireflection film, the specific resin having a dry etching rate higher than that of the base resin which constitutes said antireflection film, thereby increasing the etching selection ratio (becomes more etching-resistant) of a photoresist film compared to that of the antireflection film.

In this text, "etching rate" refers to etching thickness per unit time, and "etching selection ratio" refers to ratio of value of etching resistantibility of one material with respect to that of another material.

The material of the present invention is coated for forming the antireflection film to be prepared directly above a workpiece on a semiconductor substrate and directly under the photoresist film. The material is composed of base resin and the other resin added to said base resin, the other resin having a dry etching rate higher than that of the base resin.

More concretely, if the base resin is polyimide resin or novolac resin, then a resin such as polymethyl methacrylate (PMMA), polyvinyl phenol (PVP) or polymethacrylic acid (PMAA) is added to the base resin. If said base resin is PVP, then PMMA or PMAA is added thereto.

The manufacturing method of the present invention is the method of manufacturing a semiconductor device comprising the steps of:

(1) applying an antireflection film forming material on the workpiece film prepared on the semiconductor substrate for forming the antireflection film;

(2) applying the photoresist on the antireflection film for forming the photoresist film, and exposing and developing said photoresist film;

(3) dry-etching said antireflection film using said photoresist film as a mask, and successively dry-etching the workpiece film; wherein the antireflection film forming material comprises the base resin which constitutes said material and the other resin added to said base resin, the other resin having a dry etching rate higher than that of the base resin.

By making the antireflection film contain the resin of low dry etching resistivity, the dry etching rate of the antireflection film can be augmented, that is, the etching-resistivity of the antireflection film is decreased. The reason of that can be supposed as follows.

Now, the dry etching rate of the original antireflection film (base resin of the antireflection film) is assumed $Sa$, the dry etching rate of resin A to be added to the former antireflection film is assumed $Ss$ ($Ss>Sa$), and the ratio to be occupied by resin A on a unit surface area exposed to an ion or a radical at the time of dry etching is assumed $w$. Then a dry etching rate $Ssa$ of the antireflection film containing resin A is expressed by the next equation.

$$Ssa = (1 - w) \cdot Sa + w \cdot Ss \qquad (1)$$

Here, since $Ss > Sa$ $$Ssa > Sa \qquad (2)$$

Therefore, if the dry etching rate of the photoresist film is assumed as $Sr$, the etching selection ratio of the photoresist film against the antireflection film can be increased from $Sa/Sr$ to $Ssa/Sr$.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

Figure 1A:
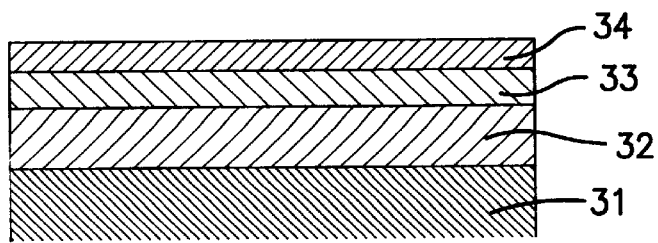
FIG. 1A to FIG. 1E are sectional views each showing, in order, a manufacturing process of a conventional semiconductor device.
Figure 1B:
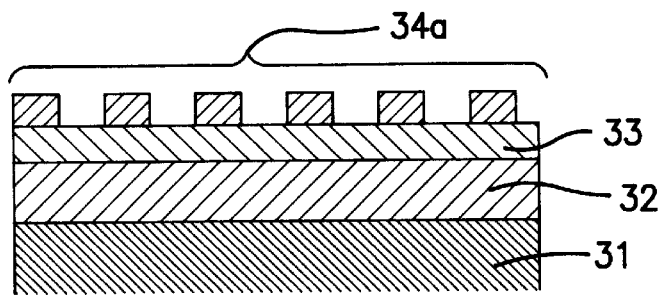
Figure 1C:
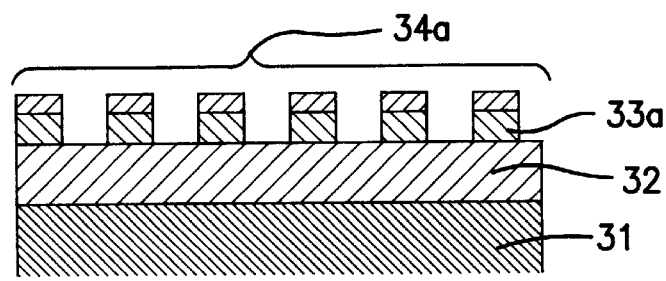
Figure 1D:
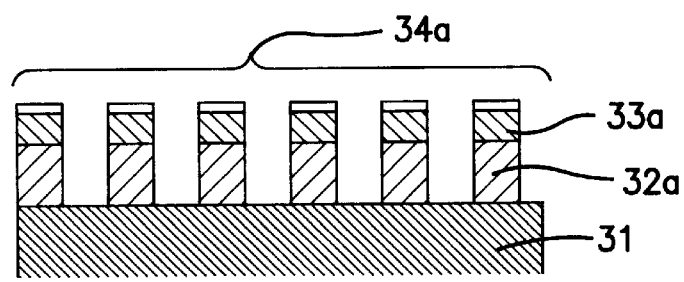
Figure 1E:
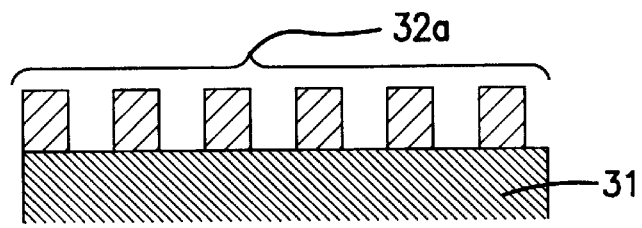
Figure 2A:
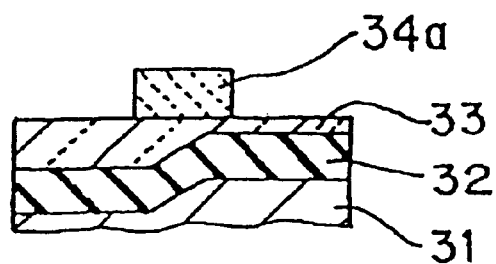
FIG. 2A to FIG. 2D are sectional views each illustrated in the process order for explaining details of how a defect is produced in a conventional workpiece.
Figure 2B:
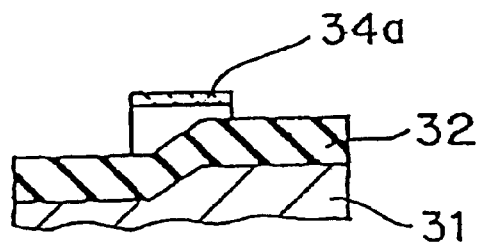
Figure 2C:
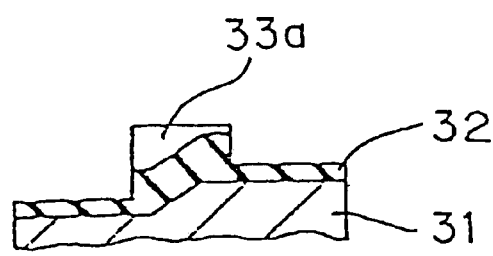
Figure 2D:
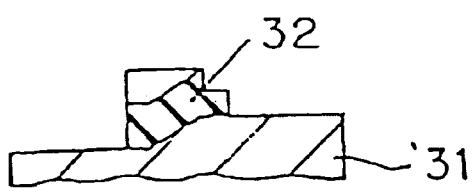
Figure 3:
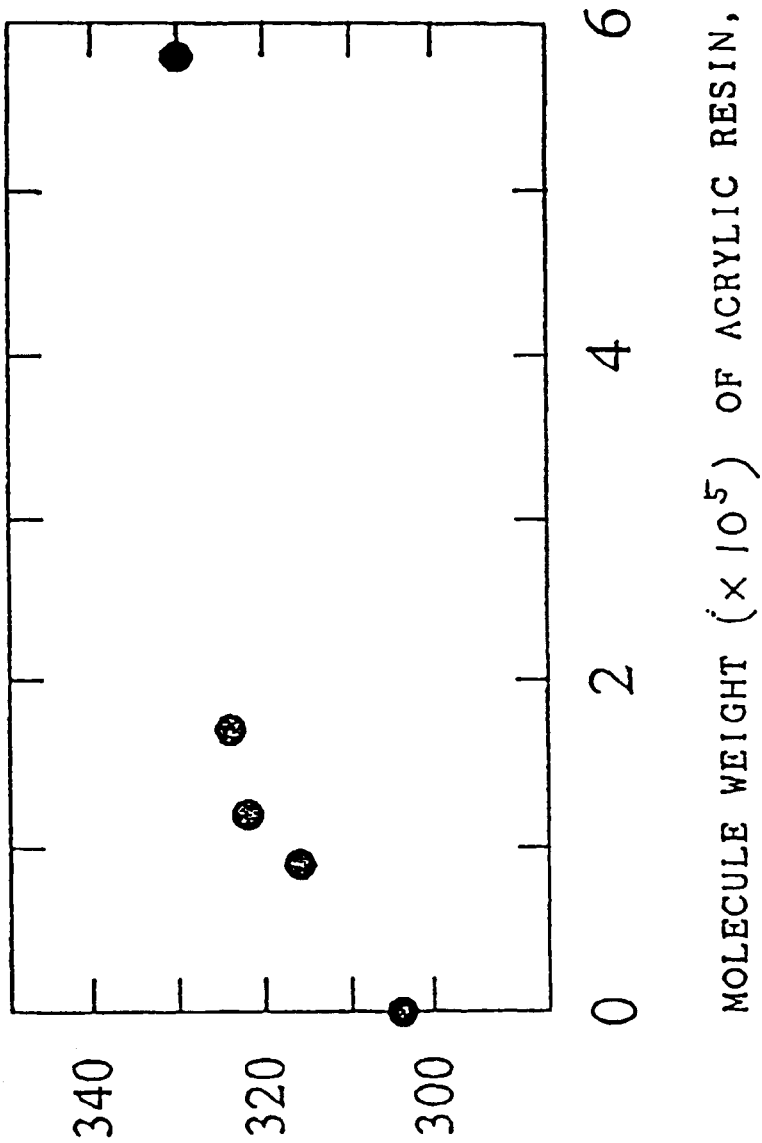
FIG. 3 shows the relation between the molecular weight of the added resin and the dry etching rate of the resin added antireflection film, for explaining the function of the present invention.

FIG. 3 is a graph showing the relation between the dry etching rate of the antireflection film and the molecular weight of added resin, when the antireflection film is compounded to contain 10% by weight of acrylic resin (polymethyl methacrylate: PMMA), the antireflection film having the dry etching selection ratio of 1.6 against the KrF photoresist. As shown in FIG. 3, the etching rate $Sa$ of the resin unadded antireflection film is 304 nm/min., and when 10% by weight of acrylic resin of molecular weight $0.9 \times 10^5$ is added thereto, the etching rate $Ssa$ is improved to 317 nm/min., and when 10% by weight of acrylic resin of molecular weight $5.8 \times 10^5$ is added thereto, the etching rate $Ssa$ is improved to 330 nm/min. Here, since the etching rate $Sr$ of the photoresist is about 190 nm/min., the etching selection ratio is improved from 1.60 to 1.67 through 1.74.

Therefore, according to the present invention, when the antireflection film is dry etched using the resist film as a mask, the thickness reduction of the resist film can be controlled, and hence it becomes possible to secure the sufficient thickness of the resist film at the time when the workpiece is etched.

Next, embodiments of the present invention will be described with reference to the drawings.

Figure 4A:
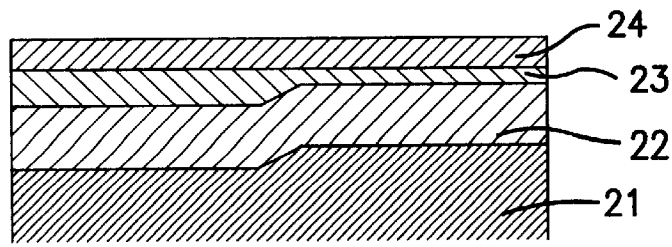
FIG. 4A to FIG. 4E are sectional views each showing, in order, a manufacturing process of the semiconductor device of the present invention.
Figure 4B:
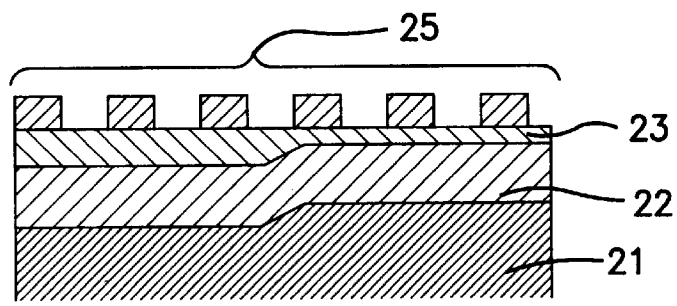
Figure 4C:
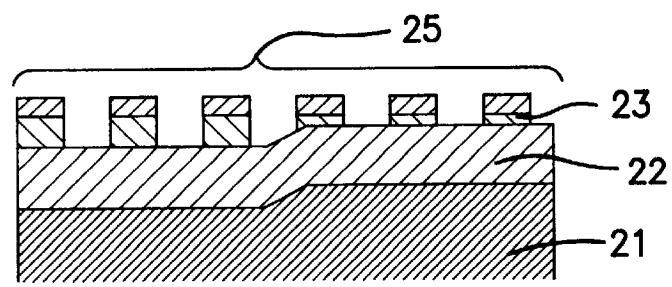

FIG. 4A to FIG. 4E are sectional views arranged in order of the manufacturing process for explaining the embodiment of the present invention. As shown in FIG. 4A, after forming workpiece 22 (for example, silicon oxide film, thickness 1 μm) on semiconductor substrate 21 which has a surface level difference of 0.4 μm, antireflection film 23 of 0.2 μm thick is formed by applying the antireflection film forming material on workpiece 22, the antireflection film forming material being formed by adding 1% by weight of acrylic resin of molecular weight $5.8 \times 10^5$ to the material comprising polyimide as base resin. The thickness of the antireflection film formed at this time is about 80 nm at the upper part and about 330 nm at the lower part. Then, the positive resist (for example, TDUR-P009 made by Tokyo Ohka Kogyo Corp.) sensitive to the excimer laser beam (for example, wavelength 248 nm) is spin coated on antireflection film 23 to form photoresist film 24 of 0.70 μm thick. Subsequently, as shown in FIG. 4B, a desired pattern is exposed by the excimer laser beam and developed to form resist film pattern 25 to be used for selectively exposing the surface of antireflection film 23. Next, as shown in FIG. 4C, by using this resist film pattern 25 as the mask, an exposed portion of antireflection film 23 is removed by dry etching (for example, the dry etching rate of photoresist film 24 is 190 nm/min., and the dry etching rate of antireflection film 23 is 330 nm/min.) to selectively expose the surface of workpiece 22. When the thickness of the antireflection film is assumed 400 nm and overetching time 50%, the required dry etching time of antireflection film 23 is 1 minute 49 seconds. Then, the decrease in film thickness of resin film pattern 25 becomes 345 nm and the thickness of the residual film of resin film pattern 25 is 355 nm.

Figure 4D:
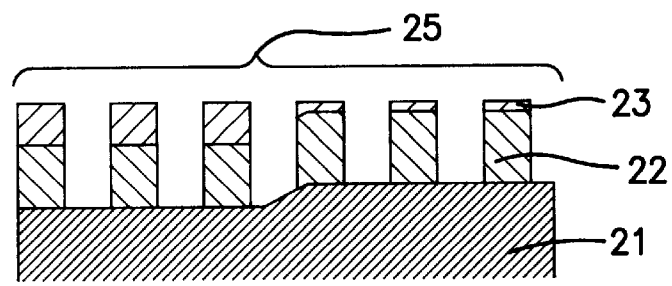
Figure 4E:
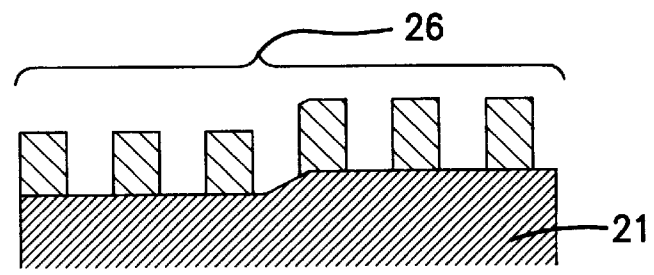

Next, as shown in FIG. 4D, by using resin film pattern 25 as the mask, the exposed portion of workpiece 22 is removed by dry etching. If the dry etching rate, for example, of resin film pattern 25 is 60 nm/min, workpiece 22 is 230 nm/min and the overetching time is 25%, the time required for etching workpiece 22 of 1 μm thick is about 5 minutes 25 seconds. Since the decrease in film thickness of resin film pattern 25 is 326 nm, even at the time when the dry etching of workpiece 22 is completed, resin film pattern 25 remains including the antireflection film. After then, as shown in FIG. 4E, by removing remaining resin film pattern 25 and antireflection film 23 by oxygen plasma, desired workpiece pattern 26 is obtained.

In the above embodiment, although acrylic resin is described as an example of the resin to be added to the base resin, any resin can be used which has the dry etching rate higher than that of the base resin of the antireflection film material. When novolac resin or polyimide group resin is used as the base resin of the antireflection film, then polymethyl methacrylate (PMMA), polyvinyl phenol (PVP) or polymethacrylic acid (PMAA) or each of the copolymers or derivatives of these material can be used as an additive resin. If the PVP is used as the base resin of the antireflection film, then PMAA or PMMA or copolymers of these material can be used as the additive resin to be added to the antireflection film.

In the above embodiment, the addition quantity is determined as 10% by weight, however, if no deposition of the addition resin is generated during storage or no large change is produced in the complex refractive index, the value of more than 10% can be employed, and it is considered that the appropriate range is about 5% to 30% by weight. Even with the antireflection film including 30% by weight of acrylic resin of the molecular weight indicated in the embodiment, similar results with those of the embodiment shown in FIG. 4A to FIG. 4E can be obtained. Further, with reference to the molecular weight, it is indicated as $5.8 \times 10^5$, but it is not limited to this value, and as shown in FIG. 3, the molecular weight can be in the range of $0.9 \times 10^5$ to $1.0 \times 10^6$ or more, and if deposition phenomenon does not occur in the storage period, the molecular weight of the resin to be added can appropriately be changed corresponding to the height of the level difference in the same way as with the resin content rate.

Further, although the positive resist which copes with the excimer laser beam is shown as the embodiment, the resist is not limited to this, and the negative resist can be applied, or similarly the positive resist or the negative resist which can correspond to the infrared radiation or the gamma ray can also be employed.

Also a silicon oxide film is shown as an example of a workpiece, but the workpiece is not limited to this, and a metal silicide film such as a tungsten silicide film or a molybdenum silicide film, a metal film made of such as aluminum, aluminum alloy or copper, semiconductors or insulation films made of such as a polysilicon film or a silicon nitride film, and all objects to be processed in the manufacturing process of the semiconductor integrated circuit device can be used as the workpiece.

As described above, in the present invention, a coating type antireflection film to be formed directly under a photoresist film is made by adding the other resin to the base resin, the other added resin having a dry etching rate higher than that of the base resin, and by using thus prepared compound resin, the etching selection ratio of the resin film can be increased against the antireflection film. Therefore, according to the present invention, even if a workpiece has a large difference in the surface level, when etching of the antireflection film using the resin film as a mask is completed, a residual film of the resist film can be secured in sufficient thickness. Therefore, according to the present invention, it becomes possible to prevent the disappearance of the resist film on the way the workpiece is etched, prevent the partial vanishment or deformation of the workpiece pattern, thereby allowing to perform the patterning of high accuracy.

It is to be understood however, that although the characteristics and advantages of the present invention have been set forth in the foregoing description, the disclosure is illustrative only, and changes may be made in the arrangement of the parts within the scope of the appended claims.

What is claimed is:

1. An antireflection film forming material to be applied directly on a workpiece having a height level difference and directly under a photoresist film to form an antireflection film, wherein said material comprises a base resin and an additive resin added to said base resin, said additive resin having a dry etching rate higher than that of said base resin, a weight percent of said additive resin and a molecular weight of the said additive resin being a function of the height level difference.

2. An antireflection film forming material according to claim 1, wherein said base resin is composed of polyimide resin or novolac resin, and said additive resin added thereto is polymethyl methacrylate (PMMA), polyvinyl phenol (PVP), polymethacrylic acid (PMAA) or a copolymer of PMMA, PVP, or PMAA.

3. An antireflection film forming material according to claim 1, wherein said base resin is polyvinyl phenol (PVP) and the additive resin added thereto is polymethyl methacrylate (PMMA), polymethacrylic acid (PMAA) or a copolymer of PMMA, PVP, or PMAA.

4. The antireflection film of claim 1, wherein said additive resin is five to thirty weight percent of said base resin.

5. The antireflection film of claim 4, wherein said additive resin is about ten weight percent of said base resin.

6. The antireflection film of claim 4, wherein said additive resin has a molecular weight of $0.9 \times 10^5$ to $1.0 \times 10^6$.

* * * * *